United States Patent

Shirahata et al.

[11] 4,002,546
[45] Jan. 11, 1977

[54] METHOD FOR PRODUCING A MAGNETIC RECORDING MEDIUM

[75] Inventors: Ryuji Shirahata; Tatsuji Kitamoto; Masaaki Suzuki, all of Odawara, Japan

[73] Assignee: Fuji Photo Film Co., Ltd., Minami-ashigara, Japan

[22] Filed: Dec. 10, 1975

[21] Appl. No.: 639,493

[30] Foreign Application Priority Data

Dec. 10, 1974 Japan .............................. 49-142160

[52] U.S. Cl. .............................. 204/192; 75/134 F; 75/170; 252/62.55; 340/174 TF; 360/131; 427/132; 428/457

[51] Int. Cl.[2] .................... C23C 15/00; B05D 5/12

[58] Field of Search .............. 204/192; 427/13, 30, 427/27, 38, 39, 40, 127, 128, 132; 360/131; 252/62.55; 75/134 F, 170

[56] References Cited

UNITED STATES PATENTS

| 3,772,174 | 11/1973 | Spalvins | 204/192 |
| 3,898,952 | 8/1975 | Shirahata et al. | 118/49.1 |
| 3,928,159 | 12/1975 | Tadokoro et al. | 204/192 |
| 3,929,604 | 12/1975 | Shirahata et al. | 204/192 |

*Primary Examiner*—John H. Mack
*Assistant Examiner*—Aaron Weisstuch
*Attorney, Agent, or Firm*—Sughrue, Rothwell, Mion, Zinn & Macpeak

[57] ABSTRACT

An improved method of making a magnetic recording medium with excellent coercive force and rectangular ratio is provided by means of an ion plating technique. A support and an evaporation source of a magnetic Co-Si alloy are placed in an ion plating apparatus which is filled with an inert gas and kept at low vacuum. High voltage is then applied between the support and the evaporation source such that the former has a negative polarity and the latter a positive polarity, thereby causing a glow discharge zone in the apparatus. The magnetic alloy is evaporated into the glow discharge zone from the source to form a magnetic thin film on the support. Such a magnetic thin film can have a coercive force of 750 Oe or more and a rectangular ratio of 0.80 or more and can be used as a magnetic recording medium.

6 Claims, 4 Drawing Figures

METHOD FOR PRODUCING A MAGNETIC RECORDING MEDIUM

BACKGROUND OF THE INVENTION

1. Field of the Invention

This invention relates to a method of making a magnetic recording medium by an ion plating technique, more particularly, to a method of making a magnetic recording medium having excellent magnetic properties, especially excellent coercive force.

2. Description of the Prior Art

It is known that conventional $\gamma$-$Fe_2O_3$, Co-doped $\gamma$-$Fe_2O_3$, $Fe_3O_4$ and $CrO_2$ powdery ferromagnetic alloys can be dispersed into an organic binder to form a coating-layer type magnetic recording medium. However, ferromagnetic metal thin films produced by electroplating, electroless plating, sputtering, vacuum deposition or ion plating have attracted special interest as non-binder type magnetic recording media, i.e., media that do not use a binder.

As one condition required for magnetic recording media for high density recording, it has been proposed to increase the coercive force of the magnetic layer by making the magnetic layer very thin. Therefore, non-binder type magnetic recording media have been sought by the art since the thickness thereof can easily be made ten times thinner than that of binder type magnetic recording media and they have a high saturated magnetic flux density.

Ion plating is a technique which was proposed by D. M. Mattox (see Japanese Patent Publication 8328/69 and U.S. Pat. No. 3,329,601). In ion plating, both a substrate and an evaporation source are disposed in an inert gas atmosphere kept at $10^{-3} - 10^{-1}$ Torr, and a DC voltage of 0.1 - 7.0 KV is then applied therebetween, the substrate and the evaporation source being connected to the negative and positive terminals, respectively, to thereby generate a glow discharge. The inert gas ions in the glow discharge impinge upon the substrate surface to clean it. After the substrate surface is cleaned, the evaporation source is heated to evaporate the metal to be deposited on the support, and the evaporated atoms are ionized in the plasma generated by the glow discharge. The ions are accelated by a strong electric field in the dark space area of the glow discharge surrounding the substrate, and have high energy and are deposited on the substrate.

In ion plating, a considerable amount of evaporation atoms are ionized and reach the substrate surface at high kinetic energy (several tens to several KeV) and both adhere to the substrate surface and cause etching due to the bombardment of the vaporized ions during the production of the thin film, whereby strong ferromagnetic metal thin films of high adhesion are obtained.

Such thin films are suitable for magnetic recording media which are employed under severe conditions, i.e., at high relative motion against a magnetic head.

In addition, the fabrication of thin films by means of ion plating can be adapted to mass-production because the production rate of the thin films is similar to that of the vacuum deposition technique, and, further, adhesion to the substrate is high as compared to the sputtering technique by which a thin film having a quality similar to the one produced by ion plating is obtained. In addition, the production of thin films by ion plating has the advantage that waste water generated by electroplating or electroless plating techniques is not a serious problem.

However, it is difficult to obtain magnetic thin films with magnetic properties as are required for magnetic recording media, particularly in coercive force (Hc) and rectangular ratio (Br/Bm), for example, a coercive force above 300 Oe and a rectangular ratio above 0.65, by means of ion plating. Even if a metal such as Fe, Co, Ni, etc., or an alloy thereof is ion plated on a substrate to form a magnetic thin film, the coercive force is 400 Oe at most and the rectangular ratio is on the order of 0.4. Therefore, the necessary magnetic properties for use as a magnetic recording media cannot be obtained.

SUMMARY OF THE INVENTION

It is the object of the present invention to provide a method of making a magnetic recording medium with excellent magnetic properties by means of ion plating.

As a result of research on magnetic recording media formed by means of ion plating, we have found that magnetic recording media with excellent magnetic properties can be produced by ion plating a magnetic alloy which consists essentially of Co and Si on a support.

The object, features and advantages of this invention and the manner of attaining them will become more apparent and the invention itself will be best understood by reference to the following description of the invention taken in conjunction with the accompanying drawings.

DESCRIPTION OF THE PREFERRED EMBODIMENTS

To make a magnetic recording medium according to this invention, a non-magnetic support of, e.g., metal or plastic, and an evaporation source containing a Co-Si magnetic alloy are placed in an inert gas atmosphere at low vacuum and a high tension voltage is applied between the support and the evaporation source in such a manner that the former is of negative polarity and the latter is of positive polarity to thereby form a glow discharge zone therebetween. The magnetic alloy is then evaporated into the glow discharge zone from the evaporation source to form a magnetic thin film on the support.

In the resulting magnetic thin film consisting essentially of Co and Si thus produced by ion plating, the coercive force and the rectangular ratio reach 750 Oe and 0.80, respectively. It will be apparent that the magnetic properties of the resulting magnetic thin film are greatly improved as compared with those produced by known ion plating techniques and that the magnetic thin film according to this invention can be used as a magnetic recording medium.

The magnetic alloys used in the present invention containing Co and Si as main components comprise one or more magnetic metals (Co, Ni, Fe) and Si, and have the composition Co-Si, Co-Ni-Si, Co-Fe-Si or Co-Ni-Fe-Si.

Figure 4:
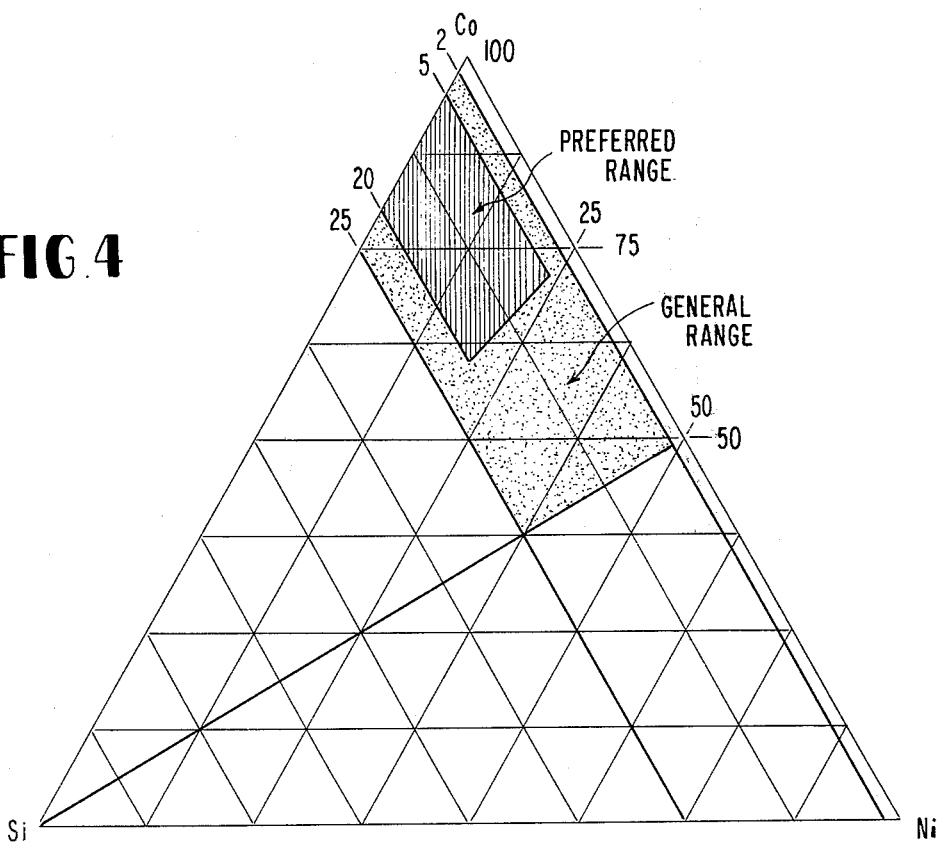
FIG. 4 is a ternary phase diagram showing generally used and preferred Co-Si-Ni proportions in the Co-Si magnetic alloy of the present invention.

The ratio of Si based on the total weight of alloy is generally about 2 to about 25 wt%, preferably 5 wt% to 20 wt% as shown in FIG. 4. If Si is present in too low a proportion, coercive force does not increase, while if Si is present in too great a proportion, coercive force does not increase and saturation magnetization ($\sigma_s$: emu/g) becomes remarkably low.

Figure 3:
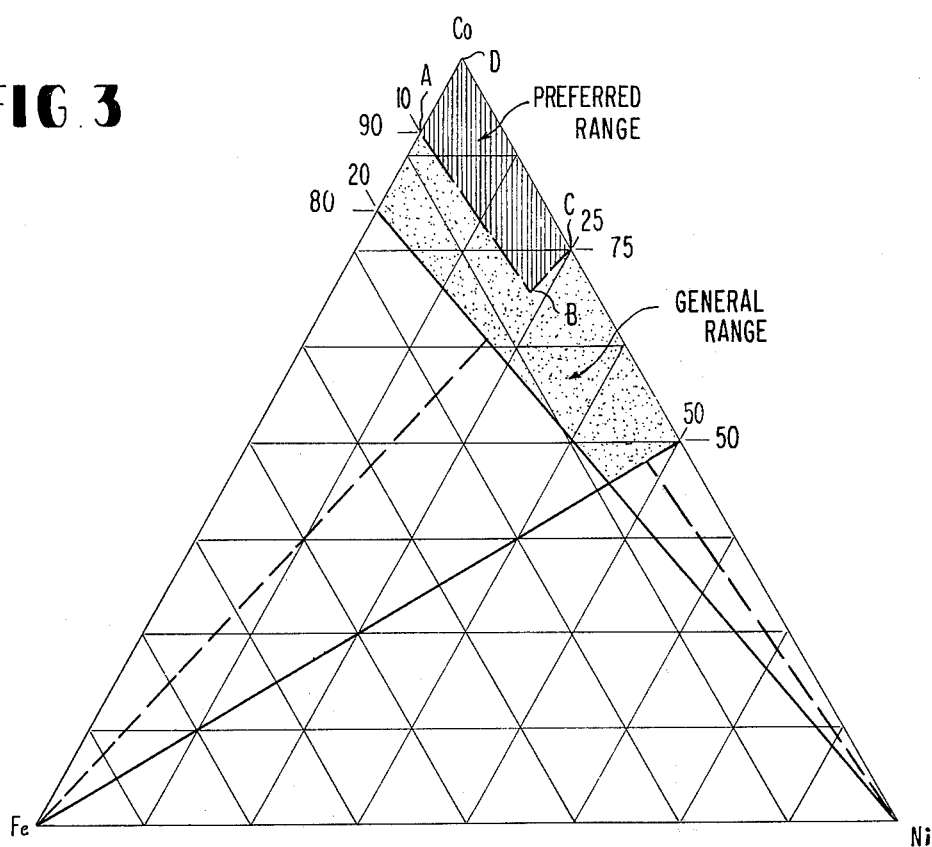
FIG. 3 is a ternary phase diagram showing generally used and preferred proportions of Co-Fe-Ni in the Co-Si magnetic alloy of the present invention.

The remainder of the Co-Si magnetic alloy (Co plus one or both of Ni and Fe) is generally Co per se or Co/Ni> about 50/50 (weight ratio), Co/Fe> about 80/20 (weight ratio); preferably Co/Ni>75/25, Co/Fe>90/10 (weight ratios) as shown in FIG. 3.

The thickness of the magnetic thin film according to the invention must be sufficient to provide sufficient output as a magnetic recording medium and to permit high density recording. Therefore, the thickness of the magnetic thin film is generally about 0.05 to about 1.0 μm, preferably 0.1 to 0.4 μm.

As the support, non-magnetic plastic materials as are conventionally used for magnetic recording media such as polyethylene telephthalate, polyimide, polyethylene naphthalate, polyvinyl chloride, cellulose triacetate and polycarbonate, and non-magnetic metals as are conventionally used for magnetic recording media such as aluminium, copper, brass and stainless steel, or inorganic materials as are conventionally used for magnetic recording media such as glasses and ceramics may be employed.

Tape, sheet, card, disc or drum shaped supports may be used, and a magnetic thin film with uniform thickness can be produced.

For carrying out the ion plating according to the invention, the degree of vacuum within the apparatus containing the inert gas is generally about $10^{-3}$ to about $10^{-1}$ Torr, preferably $5 \times 10^{-2}$ Torr. The DC voltage applied is generally about 0.1 to about 7 KV, preferably 0.2 to 5.0 KV. The time for carrying out the ion plating process is usually about 0.5 to about 20 minutes, although such depends upon the process conditions and the thickness of the magnetic thin film desired. The temperature is not overly important and can be selected in a conventional manner in accordance with established routines in the art. Any inert gas such as nitrogen, helium, neon, argon, krypton, xenon, radon, mixtures thereof, etc., may be used in the ion plating process.

More detailed disclosure on useful ion plating procedures is set forth in U.S. Pat. Nos. 3,329,601 and 3,898,952, in U.S. Pat. application Ser. No. 491,901 (filed on July 25, 1974; corresponding to Japanese Patent Application (OPI) No. 33810/1975), now U.S. Pat. No. 3,929,604, and in Japanese Patent Application (OPI) No. 33812/1975.

According to the invention, magnetic recording media having good adhesion of the magnetic layer to the support and consisting of a magnetic thin film with excellent magnetic properties can be produced by ion plating. The present invention will now be described by several detailed examples, but this invention is not be construed as limited thereto.

EXAMPLE 1

A polyethylene naphthalate base of a thickness of 25 μm was adhered to a copper cathode plate in a conventional ion plating apparatus to form a support, and a Co-Si alloy was placed in an evaporation source (the anode plate) and heated in a later step by resistance heating means to evaporate the same in a conventional manner. After the ion plating apparatus was vacuum exhausted to $10^{-5}$ Torr, helium gas was introduced to keep the interior of the apparatus at a pressure on the order of 1 Torr, and the apparatus was again vacuum exhausted to obtain a degree of vacuum of $10^{-5}$ Torr. Then, evacuation of the apparatus was again carried out while introducing helium gas thereinto from a needle valve to keep the degree of vacuum within the apparatus at $2 \times 10^{-2}$ Torr. A high tension voltage of 2.2 KV was applied between the cathode and the anode to form a glow discharge zone and thereby to clean the surface of the support. After the support surface was cleaned for 2 minutes, the evaporation source was heated to evaporate the alloy to thereby form a magnetic thin film consisting essentially of Co-Si on the support surface by ion plating. When the magnetic properties of the resulting magnetic thin film were measured, the results were as shown in the following Table 1.

Table 1

| Co-Si alloy composition | Coercive force | Rectangular ratio | Saturation magnetization |
|---|---|---|---|
| (wt % of Si) | (Hc: (Oe)) | (Br/Bm) | ($\sigma_s$: (emu/g)) |
| 5 | 300 | 0.69 | 110 |
| 8 | 515 | 0.73 | 89 |
| 10 | 710 | 0.78 | 75 |
| 12 | 400 | 0.75 | 65 |
| 15 | 315 | 0.70 | 53 |
| 20 | 255 | 0.72 | 36 |
| 25 | 75 | 0.71 | 11 |

The thickness of each magnetic film was 0.18 μm. It was found by X-ray fluorescence analysis that the magnetic films consisted essentially of Co and Si and contained trace amounts of O, Ar, N, and C. The magnetic thin films produced by ion plating the Co-Si alloy on the support surface had good coercive force and rectangular ratio, and were suitable for use as magnetic recording media. As the magnetic recording media, it is preferred to use Co-Si alloy containing 5–20 wt% of Si.

EXAMPLE 2

Using an ion plating apparatus having an evaporating source comprising an electron beam heating means, a polyimide base (25 μ thick) was adhered to a copper cathode plate, and Co-Si alloy was placed in an evaporation source (the anode plate) and heated in a later step by the electron beam heating means in a conventional manner to evaporate the same. After air in the apparatus was replaced by argon gas in the same manner as with helium in Example 1, a DC voltage of 3.5 KV was applied between the cathode and the anode plates while keeping the pressure of the argon gas at $5 \times 10^{-3}$ Torr to thereby generate a glow discharge zone in the apparatus. After the support surface was cleaned for 1 minute by the glow discharge, a DC voltage of 3.0 KV was applied between the plates, and the evaporation source heated by the electron beam to evaporate the Co-Si alloy, whereby a magnetic thin film was ion plated onto the support surface.

Figure 1:
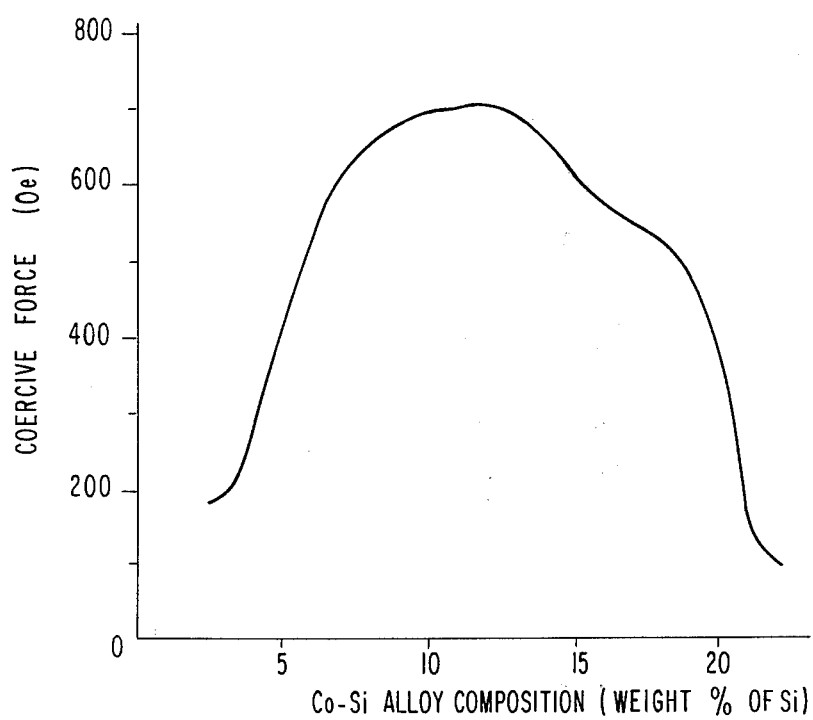
FIG. 1 is a graph showing the relationship between coercive force and the composition of a Co-Si alloy magnetic recording medium produced according to this invention.
Figure 2:
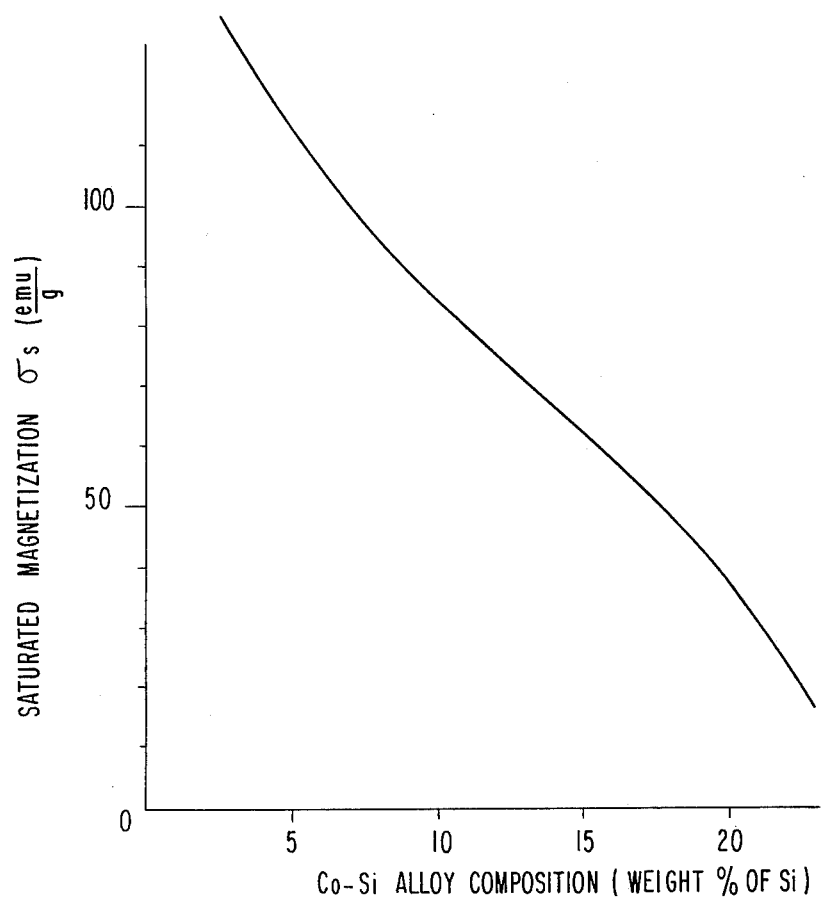
FIG. 2 is a graph showing the relationship between the saturation magnetization ($\sigma_s$:emu/g) and the composition of the Co-Si alloy magnetic recording medium produced according to this invention.

The magnetic properties of the magnetic thin films thus obtained were measured, the results of which are shown in FIGS. 1 and 2. The thickness of each magnetic film was 0.10 μm.

FIG. 1 shows the relationship between the composition of the Co-Si alloy of the resulting thin magnetic film and the coercive force of the resulting thin magnetic film, and FIG. 2 shows the relationship between the composition of the Co-Si alloy of the resulting thin magnetic film and the saturated magnetization of the resulting thin magnetic film, respectively. It will be apparent that magnetic films with excellent coercive force and saturation magnetization ($\sigma_s$ : emu/g) useful as magnetic recording media can be obtained by ion plating a Co-Si alloy, particularly a Co-Si alloy containing 5 to 20 wt% of Si, onto the support.

While the invention has been described in detail and with reference to specific embodiments thereof, it will be apparent to one skilled in the art that various changes and modifications can be made therein without departing from the spirit and scope thereof.

What is claimed is:

1. In the method of forming a magnetic recording medium comprising a support carrying a magnetic thin film thereon which comprises ion plating a magnetic alloy from an evaporation source onto a support, the polarities of said evaporation source and said support being positive and negative, respectively, in an inert gas atmosphere by applying a high tension voltage between said evaporation source and said support, the improvement wherein said magnetic alloy consists essentially of Co and Si.

2. A method of making a magnetic recording medium as claimed in claim 1, wherein said magnetic alloy contains from about 2 to about 25 wt% of Si.

3. A method of making a magnetic recording medium as claimed in claim 2, wherein said magnetic alloy contains from 5 to 20 wt% of Si.

4. A method of making a magnetic recording medium as claimed in claim 3, wherein said magnetic alloy further comprises Ni, and the Co/Ni weight ratio is > about 50/50.

5. A method of making a magnetic recording medium as claimed in claim 3, wherein said magnetic alloy further contains Fe, and the Co/Fe weight ratio is > about 80/20.

6. A method of making a magnetic recording medium as claimed in claim 3, wherein said magnetic alloy further contains Fe and Ni, and the composition thereof is defined by the area bounded by points A, B, C and D in FIG. 3 of the attached drawings.

* * * * *